(12) United States Patent
Casebolt et al.

(10) Patent No.: US 9,310,847 B2
(45) Date of Patent: Apr. 12, 2016

(54) COMPONENT REMOVAL SYSTEMS FOR PORTABLE COMPUTERS

(71) Applicant: Apple Inc., Cupertino, CA (US)

(72) Inventors: Matthew P. Casebolt, Fremont, CA (US); William F. Leggett, San Francisco, CA (US); David M. Rockford, Los Alamitos, CA (US)

(73) Assignee: Apple Inc., Cupertino, CA (US)

( * ) Notice: Subject to any disclaimer, the term of this patent is extended or adjusted under 35 U.S.C. 154(b) by 270 days.

(21) Appl. No.: 13/897,234

(22) Filed: May 17, 2013

(65) Prior Publication Data

US 2014/0123459 A1    May 8, 2014

Related U.S. Application Data

(60) Provisional application No. 61/784,384, filed on Mar. 14, 2013, provisional application No. 61/721,852, filed on Nov. 2, 2012.

(51) Int. Cl.
*B23P 11/00* (2006.01)
*G06F 1/16* (2006.01)

(52) U.S. Cl.
CPC ......... *G06F 1/1658* (2013.01); *Y10T 29/49822* (2015.01); *Y10T 29/49945* (2015.01); *Y10T 29/53909* (2015.01)

(58) Field of Classification Search
CPC ..................................................... B32B 43/006
USPC ............................................................ 428/77
See application file for complete search history.

(56) References Cited

U.S. PATENT DOCUMENTS

2004/0086710 A1* 5/2004 Pitzen et al. ................. 428/343
2009/0229766 A1   9/2009 Aveldson et al.

FOREIGN PATENT DOCUMENTS

WO   2007/032902   3/2007
WO   2009/151686   12/2009

* cited by examiner

*Primary Examiner* — Brent O'Hern
(74) *Attorney, Agent, or Firm* — Downey Brand LLP (57) ABSTRACT

The described embodiments relate generally to components used in a portable computing device and more particularly to mounting a component with a component extractor that allows a component to be removably affixed to a portable computing device. The component extractor can include a compressible securing portion configured to secure the component to the portable computing device and an extracting portion arranged to apply an extracting force to the compressible securing portion to detach the component from the portable computing device. The compressible material can be made of a highly extensible material. In one embodiment, a low friction material can be provided along an edge of the component such that the component extractor slides along the edge during an extraction procedure.

13 Claims, 8 Drawing Sheets

COMPONENT REMOVAL SYSTEMS FOR PORTABLE COMPUTERS

CROSS-REFERENCE TO RELATED APPLICATIONS

This application claims the benefit of U.S. Provisional Patent Application No. 61/784,384, filed Mar. 14, 2013, and entitled COMPONENT REMOVAL SYSTEMS FOR PORTABLE COMPUTERS, and U.S. Provisional Patent Application No. 61/721,852, filed Nov. 2, 2012 and entitled "INTERNAL COMPONENT ADHESIVE REMOVAL SYSTEMS FOR PORTABLE COMPUTERS", both of which are incorporated herein by reference in their entirety for all purposes.

FIELD OF THE DESCRIBED EMBODIMENTS

The described embodiments relate generally to mounting and removing components in a computing device. More particularly, embodiments related to mounting and removal systems that allow components to be removably affixed to a portable computing device are described.

BACKGROUND

A portable computing device can include many components that provide operational functionality for users of the device. A typical portable computing device can include a processor, one or more fans, speakers, batteries and the like. The sizes of portable computing devices are continually shrinking in response to the user's desire for smaller, lighter devices. As a result, internal components of the portable computing device and mounting systems for those components are also becoming smaller.

One method for mounting components within a portable computing device includes the use of double-sided adhesive tape. However, this method can make removing the component difficult and time consuming and can leave behind adhesive residue that must be cleaned before reinstalling the component. These problems can minimized by using an adhesive tape with a highly extensible backing designed to release from a substrate when the tape is stretched in a direction approximately equal to the surface of the adhesive tape. For example, Command™ adhesives produced by 3M™ and Powerstrip™ adhesives produced by Tesa™ have these properties. However, removing these adhesive tapes can require sufficient clearance to pull the adhesive backing in a direction approximately equal to the surface of the tape. Often, components in portable computing devices can be mounted in cavities with adhesive tape bonding the component to a bottom surface. This can require the adhesive to be pulled at an angle approximately normal to the surface of the tape, causing the tape to break.

SUMMARY OF THE DESCRIBED EMBODIMENTS

This paper describes various embodiments that relate to methods and systems for mounting and removing components within an electronic device.

According to one embodiment, a component extractor for extracting a component from a housing is described. The component extractor includes a compressible securing portion designed to secure the component to an interior surface of the housing at a securing thickness. The component extractor also includes an extracting portion coupled at a non-zero angle to the compressible securing portion at a junction. The extracting portion is arranged to receive and transfer an extracting force to the compressible securing portion by way of the junction reducing the thickness of the compressible securing portion at a detaching region to a reduced thickness. The detaching region is located a distance away from the junction to cause detachment of the component.

According to an additional embodiment, a method for installing a component in a housing is described. The method includes receiving a component having a low friction material at an edge. The method also includes securing the component to an interior surface of the housing the component extractor. The component extractor includes a compressible securing portion and an extracting portion. The compressible securing portion secures the component to the interior surface and the extracting portion is coupled at a non-zero angle to the compressible securing portion at a junction. The method also includes aligning the junction over the low friction material such that an extracting force applied to the extracting portion transfers to the compressible securing portion by way of the junction, reducing the thickness of the compressible securing portion at a detaching region to a reduced thickness. The securing thickness is associated with securing the component to the interior surface and the reduced thickness is associated with detachment of the component from the interior surface.

According to another embodiment, a method of extracting a component from a housing a component extractor is described. The component extractor includes a compressible securing portion coupled to an extracting portion at a junction. The extracting portion is at a non-zero angle in relation to the compressible securing portion at the junction. The method includes applying an extracting force to the extracting portion. The method also includes transferring the extracting force to the compressible securing portion by way of the junction to reduce a thickness of the compressible securing portion at a detaching region from a securing thickness to a reduced thickness. The detaching region is located a distance away from the junction. The component is secured to an interior surface of the housing when the compressible securing portion is at the securing thickness and detached from the interior surface of the housing when the compressible securing portion is at the reduced thickness.

Other aspects and advantages of the invention will become apparent from the following detailed description taken in conjunction with the accompanying drawings which illustrate, by way of example, the principles of the described embodiments.

BRIEF DESCRIPTION OF THE DRAWINGS

The described embodiments may be better understood by reference to the following description and the accompanying drawings. Additionally, advantages of the described embodiments may be better understood by reference to the following description and accompanying drawings. These drawings do not limit any changes in form and detail that may be made to the described embodiments. Any such changes do not depart from the spirit and scope of the described embodiments.

DETAILED DESCRIPTION OF SELECTED EMBODIMENTS

Representative applications of methods and apparatus according to the present application are described in this section. These examples are being provided solely to add context and aid in the understanding of the described embodiments. It will thus be apparent to one skilled in the art that the described embodiments may be practiced without some or all of these specific details. In other instances, well known process steps have not been described in detail in order to avoid unnecessarily obscuring the described embodiments. Other applications are possible, such that the following examples should not be taken as limiting.

In the following detailed description, references are made to the accompanying drawings, which form a part of the description and in which are shown, by way of illustration, specific embodiments in accordance with the described embodiments. Although these embodiments are described in sufficient detail to enable one skilled in the art to practice the described embodiments, it is understood that these examples are not limiting; such that other embodiments may be used, and changes may be made without departing from the spirit and scope of the described embodiments.

As the size and weight of computing devices and other electronic devices decreases, retention mechanisms for components included in these devices become smaller as well. Adhesive tape can be particularly effective at retaining components within a device while occupying a minimal amount of space. However, the use of adhesives can make disassembling the device more difficult when servicing or repairing the device. Several types of adhesive tape have been designed to address this problem. In particular, a pressure sensitive adhesive can be applied to one or both sides of a highly extensible backing. The backing can be formed from a highly extensible polymeric material with a high tensile strength and a lengthwise elongation at break in excess of 700%. When a force is applied to stretch the backing in a direction substantially parallel to the surface of the tape, the backing deforms causing the adhesive to elongate and detach from the surface. Examples of adhesive tapes that meet these requirements are Command™ adhesives produced by 3M™ and Powerstrip™ adhesives produced by Tesa™.

However, in some applications, surrounding structures can prevent the backing from being pulled in a direction substantially parallel to the surface of the tape. For example, the component can be housed within a cavity with adhesive tape affixing the component to a bottom surface of the cavity. A pull tab can be provided to allow a force to be exerted on the backing. However, the surrounding structure can require the pull tab and backing to be pulled at a substantial angle to the surface of the tape. The resulting friction on a corner of the component can cause the pull tab or backing to rupture before the adhesive can de-bond such that the component can be removed.

Several methods are disclosed for allowing a pull tab and adhesive tape backing to be pulled at an angle from the surface of the tape while preventing the backing from breaking. In one embodiment, a low surface energy material can be placed at the turning point for the adhesive tape. The resulting reduction in the coefficient of friction and reduced stiction at the turning point can allow a force to be exerted on the pull tab and backing at a substantial angle to the surface of the tape without breakage. In another embodiment, an edge plate can be coupled to one side of the component being retained. The plate can include a low radius corner around which the pull tab and backing and backing can turn when pulled. The low radius can prevent the pull tab and backing from catching and rupturing during the removal process.

Figure 1A:
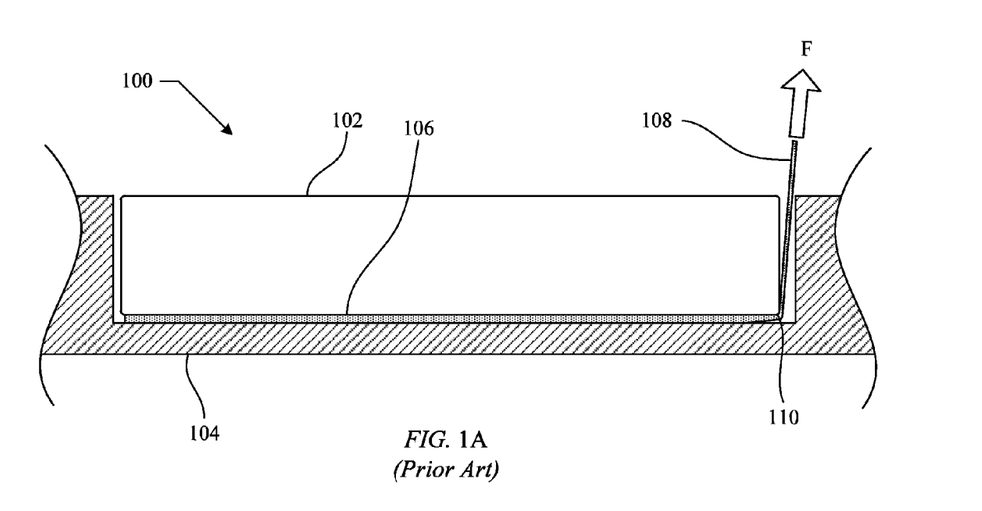
FIG. 1A shows a prior art cross-sectional view of a component housed within a cavity.

FIG. 1A shows a cross-sectional view of prior art device 100 including one or more components. Component 102 is housed in a cavity formed by surrounding structure 104. Adhesive tape 106 couples component 102 to a lower surface of structure 104. Adhesive tape 106 includes two adhesive layers separated by a highly extensible backing material configured to cause the adhesive to detach from a surface when the backing material is stretched. The backing material is coupled to pull tab 108. Pull tab 108 extends outward from the cavity formed by structure 104, allowing a force F to be applied to pull tab 108. Force F can stretch the backing material in adhesive tape 106, causing the adhesive to detach and component 102 to be released. However, pull tab 108 and adhesive tape 106 can catch on edge 110 of component 102 during the pulling process. Often, this can lead to rupture or breakage of adhesive tape 106. When a breakage occurs before adhesive tape 106 detaches from structure 104 and component 102, component 102 must be pried from the cavity in structure 104. This risks damaging component 102 and leaves adhesive residue on surfaces of component 102 and structure 104.

Figure 1B:
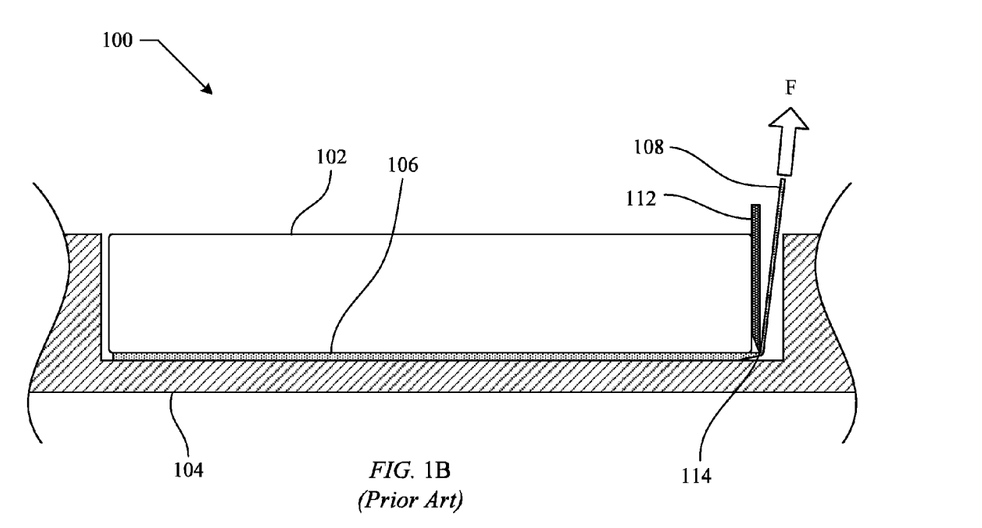
FIG. 1B shows a prior art cross-sectional view of a tool capable of removing a component housed within a cavity.

FIG. 1B shows a cross-sectional view of another embodiment of prior art device 100 where tool 112 is used to remove adhesive tape 106. Tool 112 can be formed from a material having a low coefficient of friction and can include corner 114. The combination of the low stiction of tool 112 and the small radius of corner 114 can allow pull tab 108 and adhesive tape 106 to travel around corner 114 when a force is applied to pull tab 108 without breaking adhesive tape 106. However, there are several disadvantages to using tool 112. For example, if tool 112 is not positioned correctly, adhesive tape 106 can still break along a corner or edge of component 102. Furthermore, many technicians who service or repair device 100 may not have tool 112. Therefore, it can be advantageous to have a solution that does not require the use of a tool.

Figure 2A:
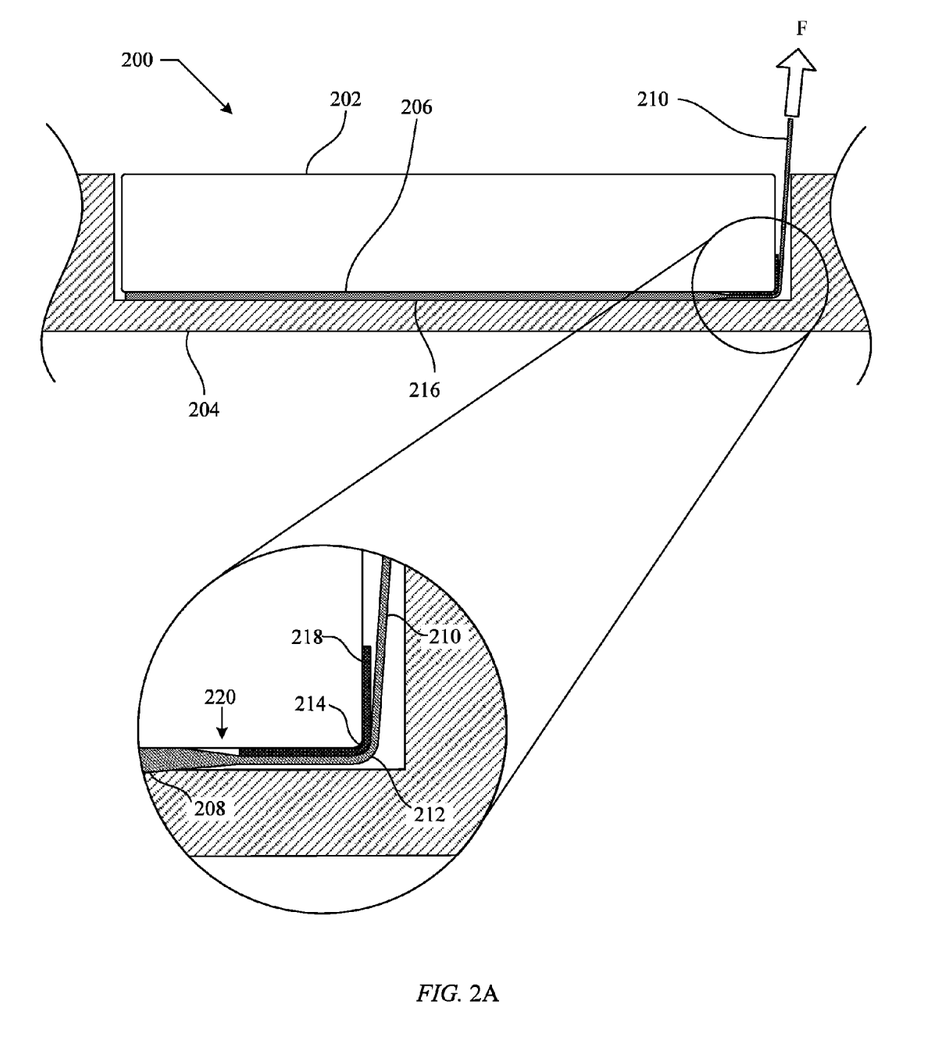
FIGS. 2A-2C show cross-sectional views of a component including a low friction material and a component extractor installed in a cavity of a structure.

FIG. 2A shows a cross-sectional view of component extractor system 200, including component 202 housed within a cavity formed in structure 204. System 200 can represent a computing device, mobile device, media player, or any other device in which internal components can be housed. Component 202 can represent a variety of internal components including batteries, fans, speakers, circuit boards, and other electronic components. Structure 204 can include a cavity configured to at least partially house component 202. Component 202 can be coupled to a bottom surface 216 of the cavity using component extractor 206. Component extractor 206 can include compressible securing portion 208 and extracting portion 210 which are coupled at junction 212. Compressible securing portion 208 can be configured to secure component 202 to an interior surface of structure 204, such as bottom surface 216. Extracting portion 210 can be arranged to extend out of the cavity of structure 204 such that an extracting force F can be applied to extracting portion 210. In some embodiments, compressible securing portion 208 and extracting portion 210 are one continuous piece. Compressible securing portion 208 and extracting portion 210 meet at junction 212 at a non-zero angle. In one embodiment, compressible securing portion 208 and extracting portion 210 meet at junction 212 at an angle of about 90 degrees. As shown in system 200, junction 212 can be located adjacent to edge 214 of component 202. In some embodiments, edge 202 can have about a 90 degree angle.

As shown in system 200, compressible securing portion 208 can be used to affix component 202 directly on an internal surface of structure 204. In alternative embodiments, compressible securing portion 208 can be used to affix component 202 onto a surface of another component housed within structure 204. The other component can be a battery, fan, speaker, circuit board or other suitable electronic component. In some embodiments, compressible securing portion 208 is made of a homogeneous elastomeric material. In some embodiments, compressible securing portion 208 is a laminated structure. For instance, compressible securing portion 208 can include a highly extensible material having two adhesive layers placed on two sides of the backing. The highly extensible material can include an elastomeric foam material. In one embodiment, compressible securing portion 208 is in the form of an adhesive tape. One adhesive layer can be affixed onto the bottom surface 216 of a cavity of structure 204 and the other adhesive layer can be affixed onto the bottom of component 202. In some embodiments, compressible securing portion 208 is be made of a highly extensible material surrounded by a single layer of adhesive. In one embodiment, the one or more adhesive layers are made of an acrylic-based adhesive.

As described above, extracting portion 210 can be configured to extend out of the cavity of structure 204 such that an extracting force F can be applied to extracting portion 210. Extracting force F can be applied, for example, by a person or machine pulling on extracting portion 210. Extracting force F applied to extracting portion 210 can be transferred to compressible securing portion 208 by way of junction 212 to reduce the thickness of compressible securing portion 208 at a detaching region 220. When compressible securing portion 208 is at a securing thickness, compressible securing portion 208 can secure component 202 to bottom surface 216. When compressible securing portion 208 is at a reduced thickness, compressible securing portion 208 can detach component 202 from bottom surface 216. Thus, when extracting force F is transferred to detaching region 220, compressible securing portion 208 can begin to detach component 202 from bottom surface 216. As extracting force F continues to be applied to extracting portion 210, detaching region 220 can move in a direction away from junction 212 to continue reducing the thickness of compressible securing portion 208. In some cases, extracting force F is applied until substantially the entire compressible securing portion 208 has the reduced thickness. When component 202 is sufficiently detached from bottom surface 216, component 202 can be removed from the cavity of structure 204. In this way, component extractor 206 can be used to extract component 202 from structure 204. As shown, component extractor 206 can be pulled with extraction force F at an angle that is non-parallel or at a non-zero angle with relation to the compressible securing portion 208 and bottom surface 216.

Note that in some embodiment, when compressible securing portion 208 is at a reduced thickness, compressible securing portion 208 can additionally detach itself from component 202. This way component 202 can automatically be removed from component extractor 206. In some embodiments, component extractor 206 is configured to support at least part of the weight of component 202 during the extraction process. That is, component 202 can be partially lifted out of the cavity formed in structure 204 when an extraction force F is applied to extracting portion 210.

In some embodiments, edge 214 of component 202 can have a low friction material to assist the transfer of extracting force F from extracting portion 210 to compressible securing portion 208 around edge 214. Low friction material 218 can reduce the friction along edge 214 when component extractor 206 is pulled at the non-zero angle and reduce the occurrence of breakage of component of extractor 206 during the extraction process. Low friction material 218 can include any suitable material having a surface with a low coefficient of friction or low surface energy. In one embodiment, low friction material 218 can be formed from an ultra-high-molecular-weight polyethylene (UHMWPE). In another embodiment, low friction material 218 can include polytetrafluoroethylene (PTFE or Teflon®). Low friction material 218 can be coupled to component using a number of suitable methods. In some embodiments, low friction material 218 is in the form of an adhesive tape which includes a surface made of a low friction material. In alternative embodiments, component 202 has low friction material embedded within component 202 at edge 214. In other embodiments, component 202 can be covered with a low friction coating in the area of edge 214. The coating can be applied using, for example, a spray coating or painting process. In yet other embodiments, some or all of the casing of component 202 can be formed from a low friction material such as UHMWPE or PTFE. Once in place, low friction material 202 can allow component extractor 206 to be pulled around edge 214 without component extractor 206 breaking.

Figure 2B:
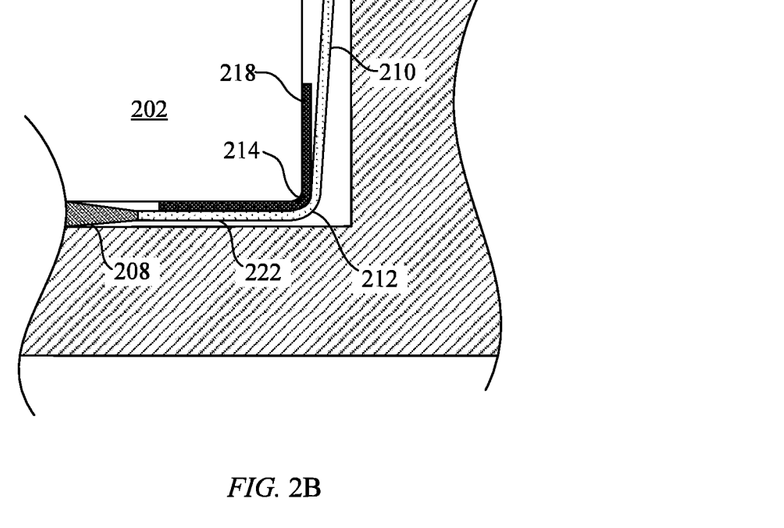
Figure 2C:
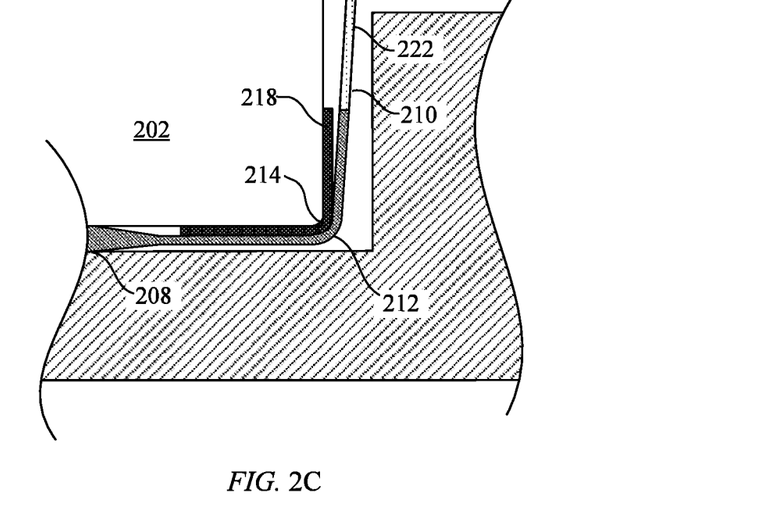

Turning to FIGS. 2B and 2C, in some embodiments, extracting portion 210 includes a pull tab 222 which can be grasped by a person or a machine to pull extracting portion 210. Pull tab 222 can be made of the same or different material as compressible securing portion 208. In one embodiment, the pull tab can be made of a plastic material which is less compressible than compressible securing portion 208. In some embodiments, pull tab 222 includes an inner portion that is made of the same material as compressible securing portion 208 and an outer sheath that covers compressible securing portion 208. Pull tab 222 can have a thickness that is thinner or thicker than compressible securing portion 208. In some embodiments, portions of pull tab 222 can have features such as grooves or projections that can facilitate the grasping of pull tab 222. In the embodiment shown at FIG. 2B, the entire extracting portion 210 includes pull tab 222 such that pull tab 222 extends past junction 212. In the embodiment shown at FIG. 2C, pull tab 222 is confined to extracting portion 210 and does not extend past junction 212.

Figure 3:
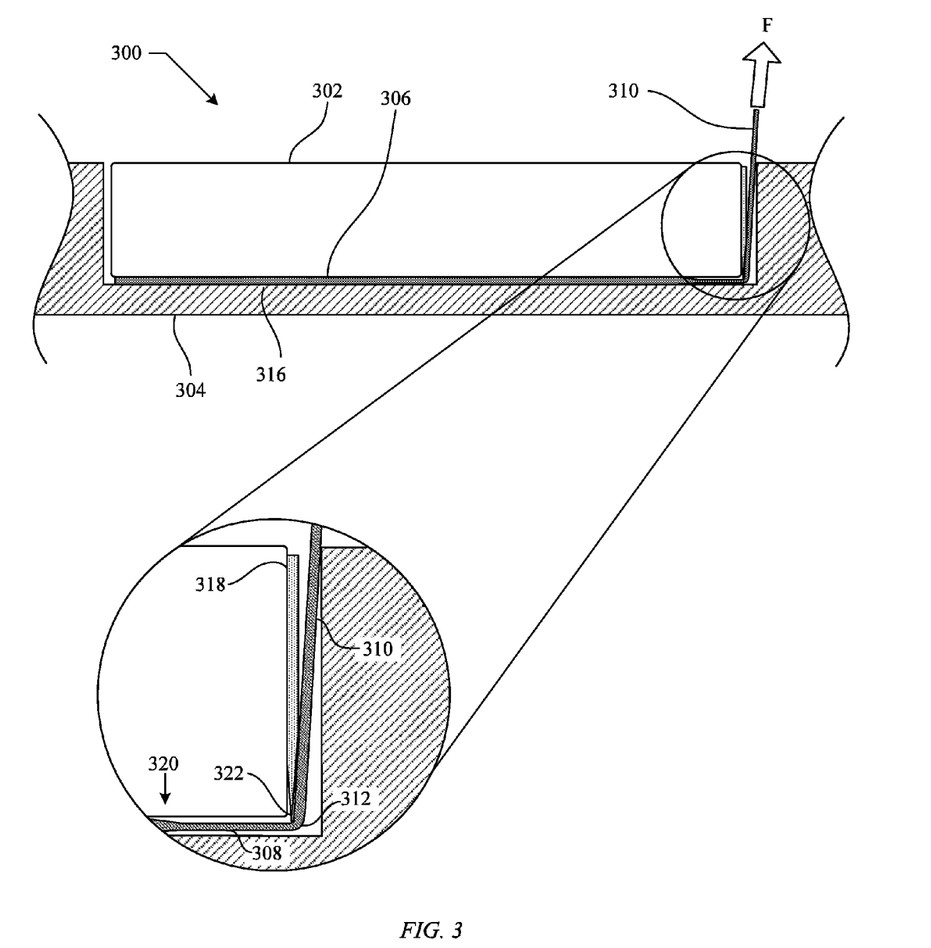
FIG. 3 shows a cross-sectional view of a component including an edge plate and a component extractor installed in a cavity of a structure.

FIG. 3 shows a cross-sectional view of system 300, demonstrating another embodiment of the present disclosure. System 300 can represent a computing device, mobile device, media player, or any other device in which internal components can be housed. Component 302 can represent a variety of internal components including batteries, fans, speakers, circuit boards, and other electronic components. Structure 304 can include a cavity configured to at least partially house component 302. Component 302 can be coupled to bottom surface 316 of the cavity using component extractor 306. Component extractor 306 can include compressible securing portion 308 and extracting portion 310 which are coupled at junction 312. Compressible securing portion 308 can be configured to secure component 302 to an interior surface of structure 304. Extracting portion 310 can be arranged to extend out of the cavity of structure 304 such that extracting force F can be applied to extracting portion 310. In some embodiments, compressible securing portion 308 and extracting portion 310 are one continuous piece. Compressible securing portion 308 and extracting portion 310 meet at junction 312 at a non-zero angle. In one embodiment, compressible securing portion 308 and extracting portion 310 meet at junction 312 at an angle of about 90 degrees.

As shown, in system 300 includes edge plate 318 that can be coupled to a side of component 302. Edge plate 318 includes acute edge 322 which has a small radius, providing a small radius around which component extractor 306 can turn when extracting force F is applied to extracting portion 310 without breaking component extractor 306. Edge plate 318 can be molded or machined from any suitably rigid material. In one embodiment, edge plate 318 can be formed from a metal such as aluminum. In another embodiment, edge plate 318 can be covered with a low friction coating such as PTFE coating. In another embodiment, edge plate 318 can be formed from a material having a low surface energy such as UHMWPE or PTFE. Edge plate 318 can be coupled to component 302 using any suitable means such as bonding, welding, fastening, or affixing using an adhesive. In another embodiment, edge plate 318 can be integrally included in the casing for component 302.

The small radius around acute edge 322 can reduce the amount of friction between component extractor 306 and edge plate 318. This can facilitate extracting force F applied to extracting portion 310 to be transferred to compressible securing portion 306 by way of junction 312 to reduce the thickness of compressible securing portion 308 at a detaching region 320. When compressible securing portion 308 is at a securing thickness, compressible securing portion 308 can secure component 302 to bottom surface 316. When compressible securing portion 308 is at a reduced thickness, compressible securing portion 308 can detach component 302 from bottom surface 316. Thus, when extracting force F is transferred to detaching region 320, compressible securing region can begin to detach component 302 from bottom surface 316. As extracting force F continues to be applied to extracting portion 310, detaching region 320 can move in a direction away from junction 312 to continue reducing the thickness of compressible securing portion 308. In some cases, extracting force F is applied until substantially the entire compressible securing portion 308 has the reduced thickness. When component 308 is sufficiently detached from bottom surface 316, component 302 can be removed from the cavity of structure 304. In this way, component extractor 306 can be used to extract component 302 from structure 304. As shown, component extractor 306 can be pulled with extraction force F at an angle that is substantially non-parallel or at a non-zero angle with relation to the adhesive portion 308.

Figure 4:
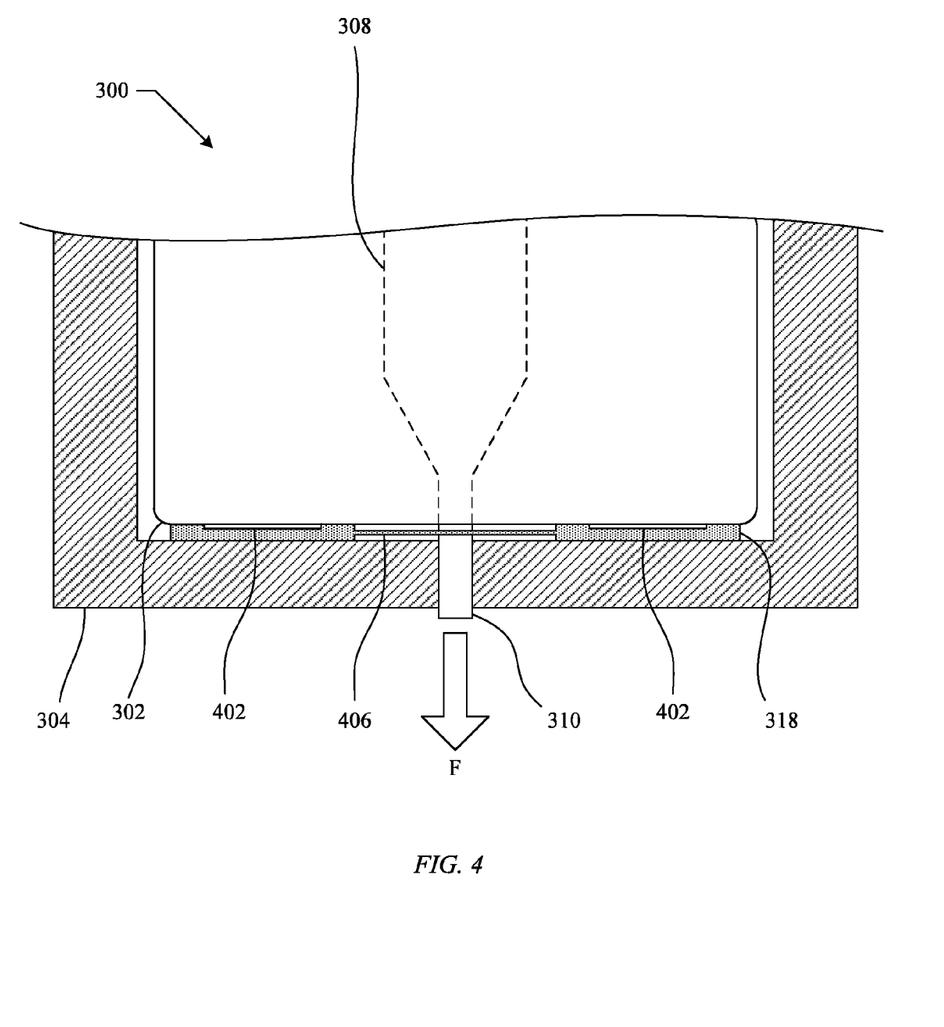
FIG. 4 shows a top-down view of the system of FIG. 3.

FIG. 4 shows a top-down view of device 300, demonstrating one configuration by which edge plate 318 can be attached to component 302. In the embodiment shown, compressible securing portion 308 can have a variable width so that a wider surface area is available for bonding along the bottom surface of component 302 and a smaller surface area is used for extracting portion 310. In other embodiments, compressible securing portion 308 can have the same width as extracting portion 310. Edge plate 318 can be coupled to component 302 using any of a number of suitable means. In one embodiment, edge plate 318 can include recesses 402 filled with an adhesive or an adhesive tape for bonding edge plate 318 to component 302. Edge plate 318 can also include narrow section 406. The thickness of narrow section 406 can reduce to an acute edge at the bottom of edge plate 318, creating a small radius corner 320 for component extractor 306 to turn on when extracting force F is applied to extracting portion 310. By combining component 302 with edge plate 318, component 302 can be easily removed for service or repair without the need for a specialized tool, such as tool 112 shown in FIG. 1B.

Figure 5:
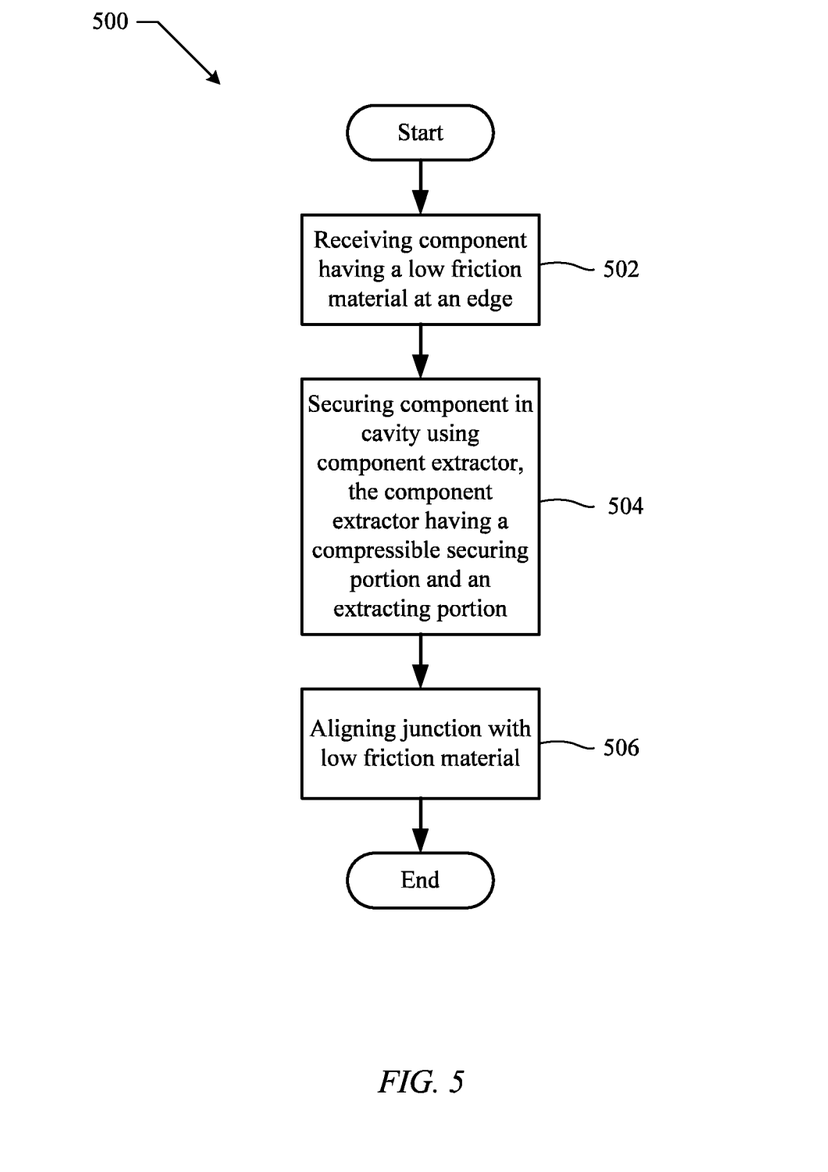
FIG. 5 shows a flow chart describing a process for installing a component including a low friction material with a component extractor in a housing.

FIG. 5 shows flowchart 500 indicating process steps for installing a component having a low friction material at and edge and a component extractor into a cavity of a structure in accordance with described embodiments. At step 502, a component having a low friction material at an edge is received. The component can include a battery, a fan, a speaker, a circuit board, or other electronic components. In one embodiment, more than one component is used. The low friction material can include an adhesive to affix the low friction material to the component. In one embodiment, the low friction material can include an adhesive tape with a PTFE backing. In additional embodiments, the low friction material can be in the form of a coating which is applied over the surface of the component. In other embodiments, the low friction material can be integrated into a case of the component. At step 504, the component is secured in the cavity using the component extractor. The component extractor includes a compressible securing portion and an extracting portion which are coupled at a junction. The compressible securing portion is configured to secure the component to an interior surface of cavity. The extracting portion is arranged to extend out of the cavity such that an extracting force can be applied to the extracting portion. At step 506, the junction is aligned over the low friction material on the component. The low friction material can reduce the amount of friction of the component extractor on the edge of the component, allowing the component extractor to be pulled at an angle without breaking.

Figure 6:
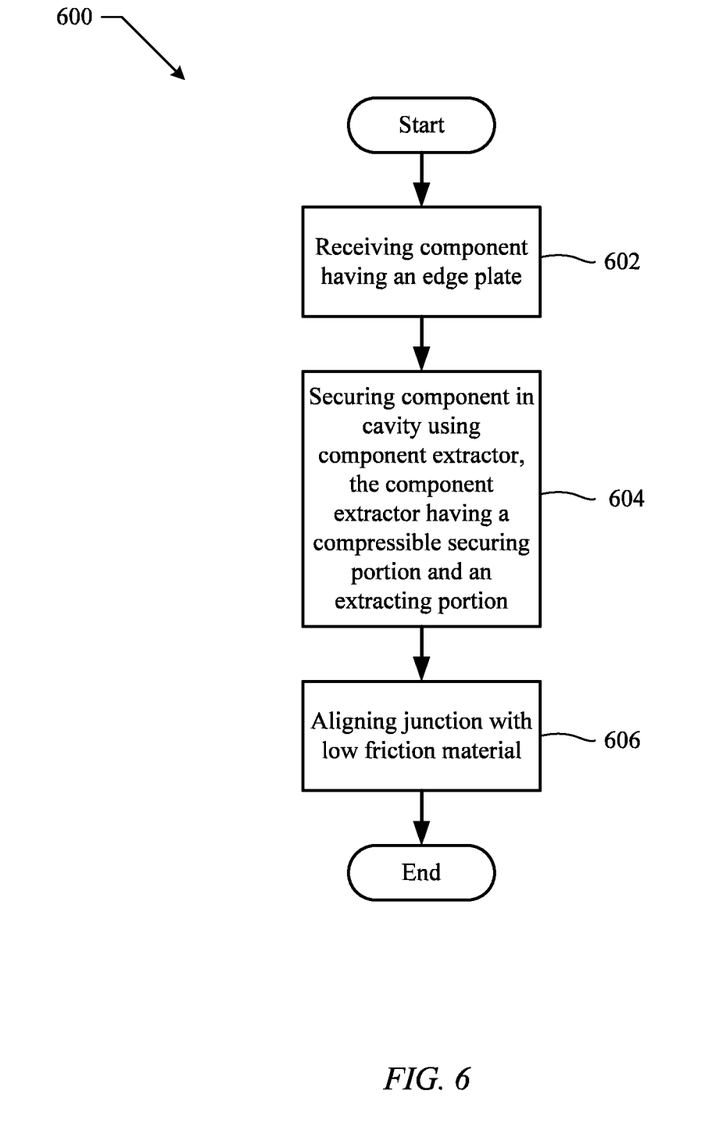
FIG. 6 shows a flow chart describing a process for installing a component including an edge plate with a component extractor in a housing.

FIG. 6 shows flowchart 600 indicating process steps for installing a component having an edge plate and a component extractor into a cavity of structure in accordance with described embodiments. At step 602, a component having an edge plate is received. The component can include a battery, a fan, a speaker, a circuit board, or other electronic components. In one embodiment, more than one component is used. As described above, the edge plate can include an acute edge configured to provide a small turning radius to facilitate the movement of component extractor during an extraction process. The edge plate can be bonded to the component using any of a number of suitable means such as use of adhesive, welding, fastening, etc. The edge plate can be made of any of a number of suitable materials, such as metal or plastic, and can include a portion of low friction material or a coating of low friction material. At step 604, the component is secured in the cavity using the component extractor. The component extractor includes a compressible securing portion and an extracting portion which are coupled at a junction. The compressible securing portion is configured to secure the component to an interior surface of cavity. The extracting portion is arranged to extend out of the cavity such that an extracting force can be applied to the extracting portion. At step 606, the junction is aligned to pass over the acute edge of the edge plate. The small turning radius around the acute edge can reduce the amount of friction of the component extractor on the edge of the component, allowing the component extractor to be pulled at an angle without breaking.

Figure 7:
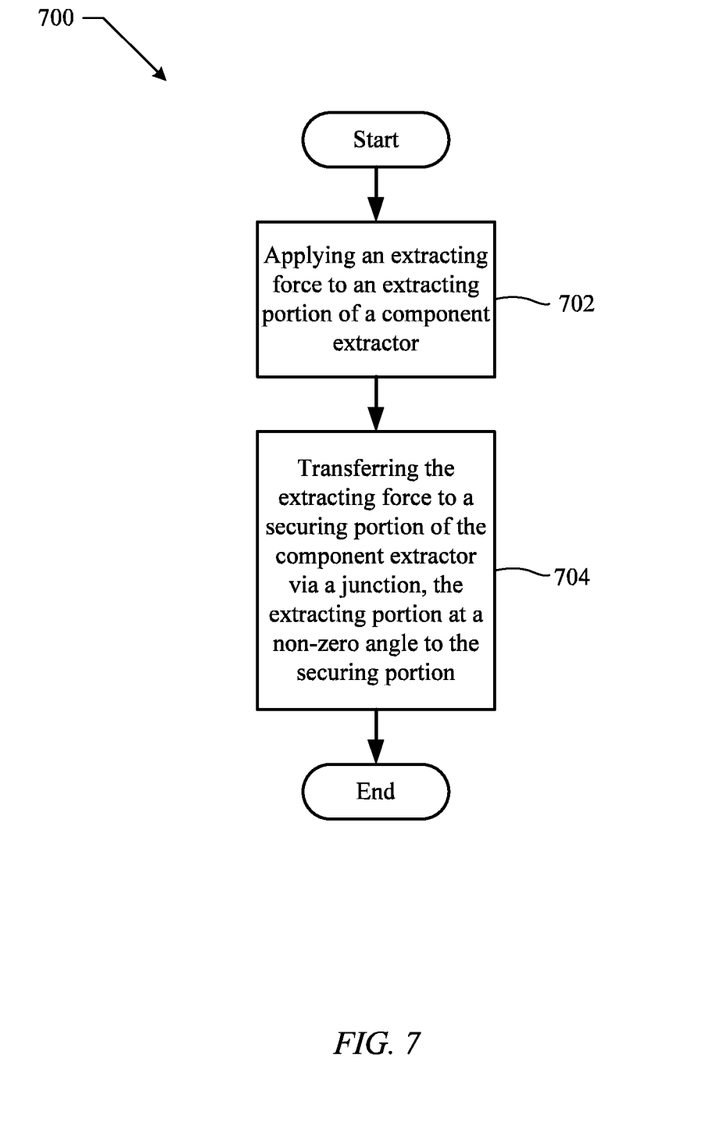
FIG. 7 shows a flow chart describing a process for extracting a component from a housing a component extractor.

FIG. 7 shows flowchart 700 indicating process steps for extracting a component from a cavity within a structure using a component extractor in accordance with described embodiments. As described above, the component extractor can include a compressible securing portion coupled to an extraction portion at a junction. At step 702, an extracting force is applied to an extracting portion of a component extractor. The extracting portion can be at a non-zero angle in relation to the compressible securing portion at the junction. In some embodiments, the junction is adjacent to a low friction material or acute edge of an edge plate that can facilitate movement of the component extractor along the edge of the component. At step 704, the extracting force is transferred to the compressible securing portion by way of the junction to reduce the thickness of the compressible securing portion at a detaching region from a securing thickness to a reduced thickness. The detaching region is located a distance way from the junction. At the securing thickness, the compressible securing portion secures the component to an internal surface of the cavity. At the reduced thickness, the compressible securing portion detaches the component from the internal surface of the cavity. In this way, the component can be detached from the interior surface of the cavity and eventually extracted from the cavity.

The various aspects, embodiments, implementations or features of the described embodiments can be used separately or in any combination. Various aspects of the described embodiments can be implemented by software, hardware or a combination of hardware and software. The described embodiments can also be embodied as computer readable code on a computer readable medium for controlling manufacturing operations or as computer readable code on a computer readable medium for controlling a manufacturing line. The computer readable medium is any data storage device that can store data which can thereafter be read by a computer system. Examples of the computer readable medium include read-only memory, random-access memory, CD-ROMs, HDDs, DVDs, magnetic tape, and optical data storage devices. The computer readable medium can also be distributed over network-coupled computer systems so that the computer readable code is stored and executed in a distributed fashion.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of specific embodiments are presented for purposes of illustration and description. They are not intended to be exhaustive or to limit the described embodiments to the precise forms disclosed. It will be apparent to one of ordinary skill in the art that many modifications and variations are possible in view of the above teachings.

What is claimed is:

1. A component extractor for extracting a component from a housing, the component having a first surface and a second surface that meet at a non-zero angle at an edge of the component, the component extractor comprising:
   a compressible securing portion that secures the first surface of the component to an interior surface of the housing; and
   an extracting portion coupled to the compressible securing portion and positioned adjacent the second surface, the extracting portion arranged to receive and transfer an extracting force to the compressible securing portion thereby reducing a thickness of the compressible securing portion and causing detachment of the component from the interior surface of the housing, wherein the component extractor slides across a polymer material positioned over a surface of the edge of the component, wherein the polymer material has a lower coefficient of friction than the surface of the edge.

2. The component extractor of claim 1, wherein the extracting portion is positioned in a space between the second surface of the component and a wall of the housing.

3. The component extractor of claim 1, wherein the component extractor is configured to support at least part of a weight of the component such that the component can be at least partially lifted from the interior surface of the housing during extraction of the component from the housing.

4. The component extractor of claim 1, wherein the compressible securing portion comprises a compressible material disposed between a first layer of adhesive and a second layer of adhesive.

5. The component extractor of claim 4, wherein the first layer of adhesive is adhered to the first surface of the component and the second layer of adhesive is adhered to the interior surface of the housing.

6. The component extractor of claim 1, wherein the housing is for a portable computing device.

7. The component extractor of claim 1, wherein the interior surface is an internal surface of the housing.

8. The component extractor of claim 1, wherein the interior surface is a surface of another component housed within housing.

9. The component extractor of claim 1, wherein the non-zero angle is about 90 degrees.

10. The component extractor of claim 1, wherein the polymer material is adhered to the component.

11. The component extractor of claim 10, wherein the polymer material is comprised of an ultra-high-molecular-weight polyethylene.

12. The component extractor of claim 1, wherein the polymer material is comprised of polytetrafluoroethylene.

13. The component extractor of claim 1, wherein the extracting portion includes a pull tab configured to be grasped and pulled to facilitate application of the extracting force.

* * * * *